(12) United States Patent
Karri et al.

(10) Patent No.: US 6,363,506 B1
(45) Date of Patent: Mar. 26, 2002

(54) METHOD FOR SELF-TESTING INTEGRATED CIRCUITS

(75) Inventors: Ramesh Karri, New York, NY (US); Nilanjan Mukherjee, Monmouth Junction, NJ (US)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/291,448

(22) Filed: Apr. 13, 1999

(51) Int. Cl.[7] .............................................. G01R 31/28

(52) U.S. Cl. ....................................... 714/733; 714/739

(58) Field of Search .......................... 370/244; 714/735, 714/820, 732, 30, 42, 733, 739, 738, 741

(56) References Cited

U.S. PATENT DOCUMENTS

| 4,493,073 A | * | 1/1985 | Witmore et al. ............. 370/244 |
| 4,684,885 A | * | 8/1987 | Chapman et al. ............ 714/735 |
| 5,200,963 A | * | 4/1993 | Chau et al. .................. 714/820 |
| 5,668,817 A | * | 9/1997 | Adham ........................ 714/732 |
| 5,991,898 A | * | 11/1999 | Rajski et al. .................. 714/30 |
| 6,088,817 A | * | 7/2000 | Haulin ......................... 714/42 |

OTHER PUBLICATIONS

C. Stroud et al. "A Parameterized VHDL Library for On–Line Testing" *IEEE Proceedings International Test Conference*, pp. 479–488, Jul. 1997.
N. Mukherjee et al. "Design of Testable Multipliers for Fixed–Width Data Paths" *IEEE Transactions on Computers*, vol. 46, No. 7, pp. 795–810, Jul. 1997.
S. Dey et al. "Synthesizing Designs with Low–Cardinality Minimum Feedback Vertex Set for Partial Scan Application" IEEE, 0–816–5440, pp. 2–7, Jun. 1994.
N. Mukherjee et al. "Arithmetic Built–In Self Test for High–Level Synthesis" *IEEE*, 0–8186–7000, pp. 132–139, Feb. 1995.
S. Chiu, et al. "A Design for Testability Scheme with Applications to Data Path Synthesis" *ACM/IEEE Design Automation Conference*, pp. 271–277, Jul. 1991.
T–C. Lee, et al. "Behavioral Synthesis for Easy Testability in Data Path Scheduling" *IEEE*, 0–816–3010, pp. 616–619, Aug. 1992.
C–H. Chen, et al. "BETA: Behavioral Testability Analysis" *IEEE*, CH3026, pp. 202–205, Feb. 1991.
D. Gizopoulos, et al. "An Effective BIST Scheme for Datapaths" *IEEE International Test Conference*, pp. 76–85, Jun. 1996.
L. Avra "Allocation and Assignment in High–Level Synthesis for Self–Testable Data Paths" *IEEE International Test Conference*, pp. 463–472, 1991.
K. Saluja, et al. "A Concurrent Testing Technique for Digital Circuits" *IEEE Transactions on Computer–Aided Design*, vol. 7, No. 12, pp. 1250–1260, Dec. 1988.
R. Singh, et al. "Concurrent Testing in High Level Synthesis" *IEEE*, pp. 96–103, May 1994.
J. Rajski, et al. "Accumulator–Based Compaction of Test Responses" *IEEE Transactions on Computers*, vol. 42, No. 6, pp. 643–650, Jun. 1993.

* cited by examiner

*Primary Examiner*—David Ton
(74) *Attorney, Agent, or Firm*—Darby & Darby

(57) ABSTRACT

A versatile testing scheme provides both off-line and on-line integrated circuit testing using common test circuitry. The testing scheme generates test patterns, applies test patterns and compacts test responses to test the integrated circuit. The original design of the integrated circuit may be modified so that the functional units of the original design perform test operations during idle processing cycles in the normal mode of operation. To this end, functional units of the design may be constrained to perform the test function by coordinating the generation and application of the test patterns and the compaction of the test responses with a usage profile of the functional units.

26 Claims, 5 Drawing Sheets

METHOD FOR SELF-TESTING INTEGRATED CIRCUITS

FIELD OF THE INVENTION

The present invention relates to the testing of integrated circuits and, more specifically, to a versatile built-in self-test that provides both on-line and off-line integrated circuit testing.

BACKGROUND OF THE INVENTION

Conventional integrated circuits (such as microprocessors and digital signal processors) typically are defined as a collection of interconnected basic functional units. The functional units define operations that are repeatedly used in a given design. For example, a storage register functional unit defines a circuit that stores a data word in the integrated circuit. Arithmetic functional units such as adders define circuits that add two data words in the integrated circuit. An integrated circuit, then, consists of a particular collection of registers, adders, etc., that are connected in such a manner as to provide the overall functionality defined for the integrated circuit. In practice, integrated circuits typically contain thousands of functional units such as those described above.

A variety of testing schemes have been used to ensure that an integrated circuit performs as intended. For example, the built-in self-test ("BIST") scheme tests the functional units of an integrated circuit using additional circuitry that is built into the integrated circuit. BIST techniques have been used in both off-line and on-line integrated circuit testing.

Off-line BIST is used to test the integrated circuit while the integrated circuit is not in use. For example, off-line BIST typically is used to test integrated circuit devices during production.

In off-line BIST, the test circuitry generates test patterns and compacts the responses the functional units of the integrated circuit had to the test patterns. Typical BIST structures used for off-line testing include linear feedback shift register (LFSR) pattern generators for generating the test patterns and multiple input signature register (MISR) test response compactors for compressing the test responses. Conventionally, these test structures are only used during a test mode.

Off-line BIST schemes have been used to test data-path architectures in digital signal processors. Regular structures such as multipliers, adders, subtractors, registers, and arithmetic logic units form the core of these architectures. Research has shown that these regular structures are testable using small, constant size test sets (C-testable). See, for example, the paper entitled "An Effective BIST Scheme for Data Paths" by Gizopoulos, D., et al., Proc. International Test Conference, pp. 76–85, November 1996. The fixed size of these test sets translates into a constant test application time. Research has also identified C-testable test sets that can be generated using regular blocks such as counters and accumulators.

On-line BIST is used to test the integrated circuit while the integrated circuit is in use. For example, on-line BIST may be used to test a microprocessor when the microprocessor is executing instructions. On-line BIST is primarily based on space, time or information redundancy. As a result, typical on-line BIST structures include replicated hardware, comparators and checkers.

Due in large part to the above described differences between on-line and off-line BIST structures, it may be relatively inefficient to implement both off-line and on-line BIST on the same integrated circuit. Studies have shown that such an implementation may require as much as 50% area overhead in comparison to a design without BIST. See, for example, Stroud, C., et al., "A Parameterized VHDL Library For On-line Testing," Proc. International Test Conference, pp. 479–488, November 1997.

A variety of techniques have been proposed to improve testability of data-path designs. Controllability and observability have been used to guide testable data-path synthesis. Chen, C-H., et al., "BETA: Behavioral Testability Analysis," Proc. International Conference on CAD, pp. 202–205, October 1991. Other testability metrics used in literature include the sequential depth, feedback loops and register adjacency. See, for example, T-C. Lee et al., "Behavioral Synthesis for Easy Testability in Data Path Scheduling," Proc. IEEE International Conference on CAD, pp. 616–619, November 1992; S. Dey et al., "Synthesizing Designs with Low-Cardinality MVFS for Partial Scan Synthesis," Proc. IEEE VLSI Test Symposium, pp. 2–7, April 1994; and, L. Avra et al., "Allocation and Assignment in High-Level Synthesis for Self-Testable Data-Paths," Proc. International Test Conference," pp. 272–279, October 1992, respectively. To provide pseudo-random test patterns and to compact test responses, techniques have been developed to identify registers that can be transformed into LFSRs and MISRs. See S. Chiu and C. A. Papachristou, "A Design for Testability Scheme with Applications to Data Path Analysis," Proc. IEEE/ACM Design Automation Conference, pp. 271–277, June 1991. The main objective of these techniques is to minimize the number of transformed registers. A proposed pseudo-exhaustive BIST scheme called arithmetic BIST ensures complete state coverage at the input of all functional units incorporated in the design. N. Mukherjee, J. Rajski, J. Tyszer, "Design of Testable Multipliers for Fixed-Width Data Paths." IEEE Trans. on Computers, vol. 46, no. 7, pp. 795–810, July 1997. A data-path BIST scheme has been proposed that (i) guarantees high fault coverage without time consuming iterative fault simulation; (ii) has an implementation independent fault model; and (iii) uses a small test set that is independent of the data-path width. See the Gizopoulos et al. paper referenced above. All these schemes are targeted toward off-line testing.

An article by R. Singh and J. Knight entitled "Concurrent Testing in High-Level Synthesis", Proceedings of International Symposium on High-Level Synthesis, May 1994, pp. 96–103, discusses a pseudo-random testing method. The method involves 1) initially scheduling and allocating the functional data-flow graph; 2) determining a test data-flow graph by identifying test paths that will provide access to the functional units during their idle time; and 3) using LFSR for test pattern generation and MISR for test response compaction during the test phase. Here, internal registers of the circuit are converted into LFSRs and MISRs. In addition the method uses a separate BIST controller.

This method has several drawbacks. For example, the method typically will have a long test latency due to the use of the pseudo-random based test. This is because a large number of test patterns may be required to detect random-pattern resistant faults. This long test latency results, in turn, in relatively long test application times. In addition, this method typically requires a relatively high area overhead because a large number of registers are converted into LFSRs and MISRs, or because extra generators and compactors may be required.

A technique referred to as concurrent testing proposes a method of exploiting off-line testing resources for on-line testing. In concurrent testing, off-line testing resources are modified to observe the normal inputs and outputs of a combinational circuit under test during normal system operation. When a normal input matches a test pattern from its test set, the corresponding circuit output is compressed into a signature. K. K. Saluja, R. Sharma and C. R. Kime, "A Concurrent Testing Technique for Digital Circuits," IEEE Trans. on Computer Aided Design, vol. 7, no. 12, pp. 1250–1260, December 1988.

Conventional integrated circuit testing techniques such as those described above may use a significant portion of the physical area of the device or they may not provide thorough testing in an efficient manner. As a result, a need exists for a more efficient and effective method of testing integrated circuits and related devices.

SUMMARY OF THE INVENTION

The invention provides a versatile BIST technique that provides both off-line and on-line integrated circuit testing using common test circuitry. Unlike traditional on-line BIST, a test according to the invention does not need to use functional data as test inputs. Rather, the test generates test patterns, applies test patterns and compacts test responses to test an integrated circuit in a manner similar to that employed by off-line BIST.

Significantly, the test functions are performed by the functional units of the original design (i.e., the design without BIST circuitry) in conjunction with additional functional resources comparable to those required by off-line BIST alone. According to the invention, an original design is modified so that the functional units of the original design perform test operations during idle processing cycles in the normal mode of operation.

Idle processing cycles exist during the operations of many integrated circuits. For example, integrated circuit operations can be implemented using basic functional units such as multipliers, adders and subtractors. In general, these functional units are not active in every clock cycle. In fact, there typically are only a few clock cycles (if any at all) in which all functional units are active simultaneously.

The functional units of the design are constrained to perform the test function by coordinating the generation and application of the test patterns and the compaction of the test responses with the usage profile of the functional units. In one embodiment, constraints to coordinate the test functions with the functional units are incorporated in Behavioral Compiler-generated arithmetic data-paths using Synopsys synthesis scripts. Following the allocation and scheduling phases of behavioral synthesis, an idleness profile of the design is generated. That is, the designer identifies idle computation cycles (defined as operators, e.g., adders or multipliers, and the clock cycles in which they are idle) in the basic design. Next, the test function is scheduled such that the operations in the test function only use the spare computation capacity in the design. The operations of the test function are then bound to the operators in the design so that all modules in the design are tested.

By coordinating test functions with the basic design functions and by using a small test set, a test procedure according to the invention can operate concurrently with the normal function, guarantee a very high fault coverage and perform the test in a relatively short period of time (e.g., on the order of a few milliseconds). As a result, the invention may effectively be used to test an integrated circuit during on-line operations.

In summary, the invention provides a versatile BIST technique that may be used both in an off-line production test mode and in an on-line field test mode. This is accomplished with minimal impact on the performance and physical area of the design in comparison to the impact made on the performance and area of a design by an off-line BIST scheme alone.

BRIEF DESCRIPTION OF THE DRAWINGS

These and other features of the invention will become apparent from the following description and claims, when taken with the accompanying drawings, wherein similar reference characters refer to similar elements throughout and in which:

DESCRIPTION OF PREFERRED EMBODIMENTS OF THE INVENTION

Figure 1:
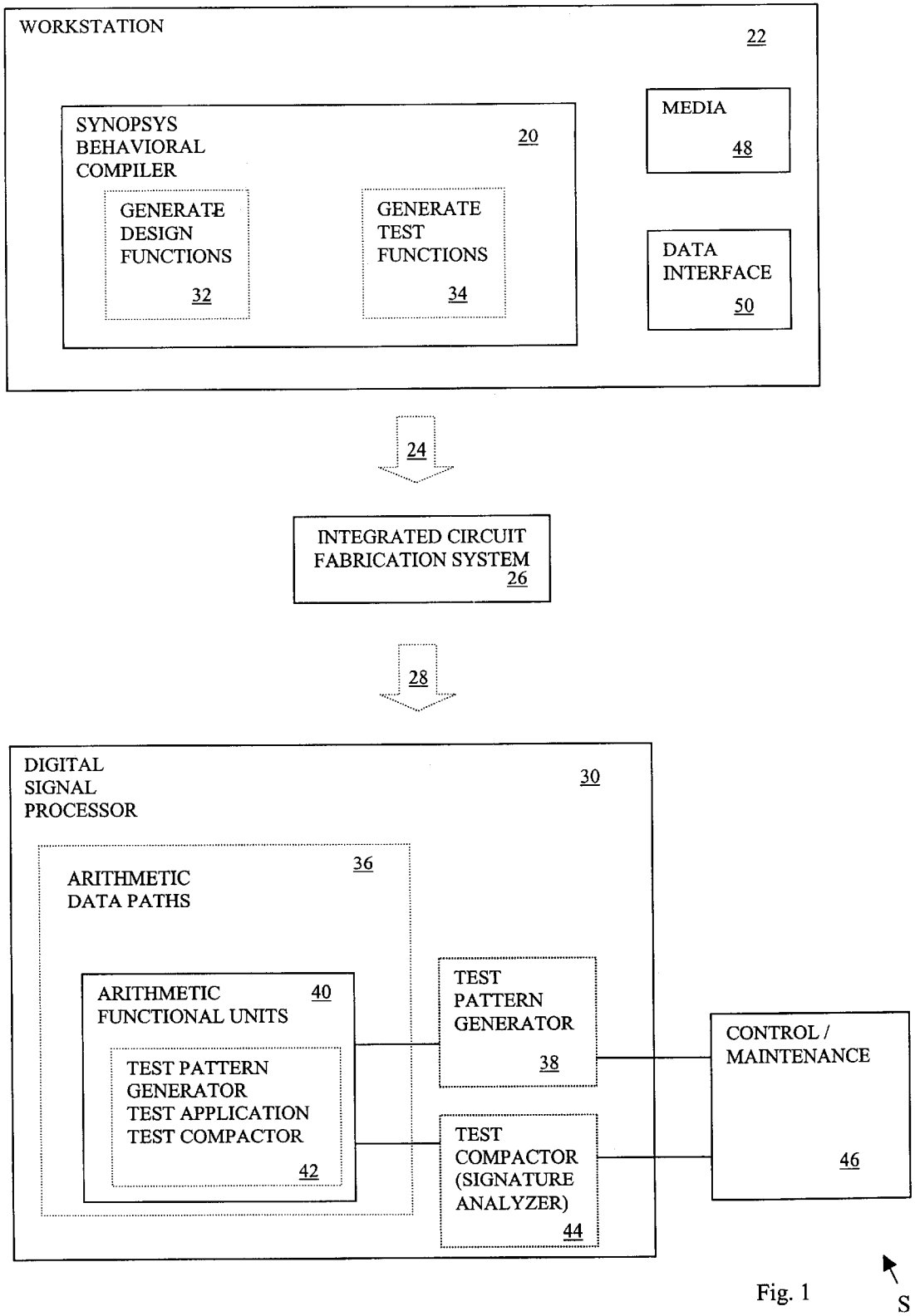
FIG. 1 is a block diagram illustrating one embodiment of an integrated circuit design and production system and an integrated circuit testing environment according to the invention.

FIG. 1 is a block diagram representing one embodiment of an integrated circuit production and test system S according to the invention. A circuit designer (not shown) uses a Synopsys Behavioral Compiler™ program 20 running on a workstation 22 to generate an integrated circuit design. As represented by arrow 24, design data generated by the program 20 is sent to an integrated circuit fabrication system 26. As represented by arrow 28, the fabrication system 26 produces an integrated circuit device such as a digital signal processor 30.

Figure 2:
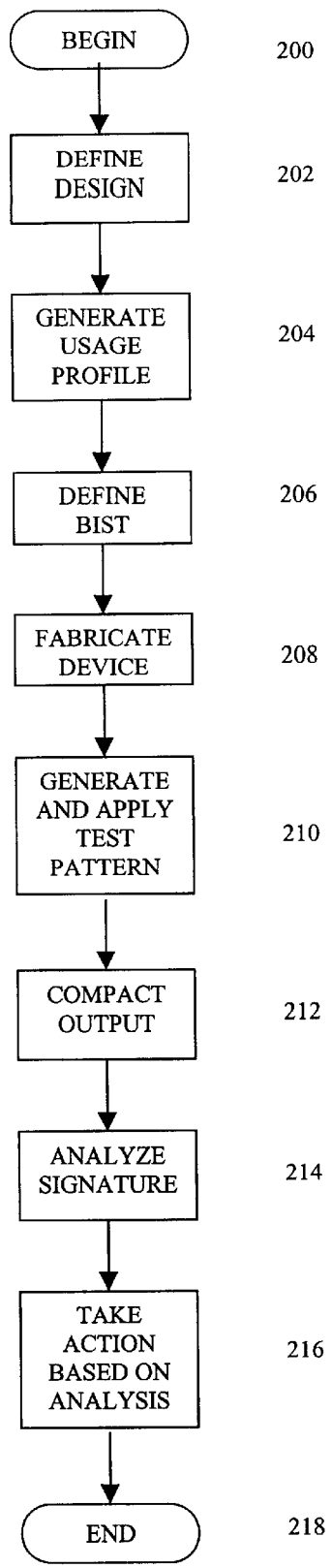
FIG. 2 is a flowchart illustrating operations that may be performed by the components of FIG. 1.

High-level operations that may be performed by the components FIG. 1 are described by the flowchart of FIG. 2, beginning at block 200. At blocks 202 through 206, the circuit designer uses the Synopsys Behavioral Compiler™ 20 to define the integrated circuit 30. Initially, the circuit designer writes scripts to define the basic design functions (block 202). This process may include, for example, specifying which functional units are to be used in the data-path of the digital signal processor 30 and specifying the interconnections between those functional units.

In accordance with the invention, the circuit designer also writes scripts to define BIST functions. Briefly, this procedure may include generating a usage profile of the design to identify idle computation cycles in the design (block 204). As represented by block 206, the designer also defines the test functions and schedules them into the design. These aspects of the test design procedure are described in more detail below.

As represented by blocks 32 and 34 in FIG. 1, the Behavioral Compiler™ 20 processes the scripts to generate data that is used by the fabrication system 26 to produce the integrated circuit device 30. For example, the compiler data is used to define the physical layout and interconnections of the functional units on a silicon wafer. Conventional integrated circuit fabrication processes (block 208) are well known in the art. Accordingly, these processes will not be discussed in more detail here.

Blocks 210 through 214 in FIG. 2 describe BIST procedures performed by the fabricated device (i.e., the digital signal processor 30). As illustrated in FIG. 1, the BIST may test arithmetic data paths 36 in the digital signal processor 30. As represented by block 40 in FIG. 1, the arithmetic data paths 36 include arithmetic functional units that perform the operations specified by the design. In a preferred embodiment, the arithmetic functional units 40 are used to perform test pattern generation, test application and test compaction functions (blocks 210 and 212). For example, one or more functional units 40 may be used to provide a test pattern generator function to produce a series of pseudo-exhaustive test vectors. The test vectors are then applied to other arithmetic functional units 40 in the arithmetic data paths 36. These operations are defined according to the test design and schedules discussed above in conjunction with block 206.

At block 212, the responses of the functional units 40 to the test vectors are compacted by functional units 40 that are used to provide, for example, a signature analysis function. Again, as represented by block 42, the compaction functions may be incorporated into the functional units 40 in the arithmetic data paths 36 according to the test design and schedules defined at block 206.

After a predefined series of test vectors have been applied and compacted, the compacted results are analyzed to determine whether the expected results were obtained (block 214). If an unexpected result was obtained, the data may be analyzed in an attempt to detect the fault in the integrated circuit that caused the error.

As represented by test pattern generator 38 and test compactor 44, in other embodiments the test pattern generation and/or the test compaction functions may be provided by circuits that are external to the functional units 40.

As represented by block 216, the system S may take action based on the test results. For example, in the event the BIST detects a fault in the data path, an error message may be sent to a control and/or maintenance component 46. Typically, the BIST is controlled by and reports to control and/or maintenance components 46 that may be external to the digital signal processor 30 (as shown) or incorporated into the digital signal processor 30. For example, for off-line BIST operations, the BIST procedures may communicate with an external test set. For on-line BIST operations, the BIST may communicate with a maintenance process running on the digital signal processor 30 which, in turn, communicates with other maintenance processes running in the system (not shown) of which the digital signal processor 30 is a part.

With the above overview in mind, components and methods that may be used in practicing the invention will now be described in more detail. Initially, to further an understanding of the process of coordinating testing functions with the usage profile of the functional units, the nature of idle clock cycles in typical integrated circuit applications will be discussed briefly.

Arithmetic data-path architectures such as those that are highly prevalent in digital signal processor applications primarily comprise multiplication operations driving an addition and/or subtraction operation. These operations can be implemented using basic functional units such as multipliers, adders and subtractors. Although several such functional units are employed, they are not active in every clock cycle. Furthermore, there are only a few clock cycles (if any at all) in which all functional units are active simultaneously.

The Behavioral Compiler™ has been used to synthesize register transfer level implementations for a select number of benchmark digital signal processor applications. This information may be used to identify the percentage of clock cycles during which functional units of a given type are idle during an iteration of the data-flow function. TABLE 1 sets forth the spare computation capacity for a set of digital signal processor algorithms including a bandpass filter (BPF), an AR-filter (ARF) and a fifth order elliptic filter (EWF). The second major column lists the number of clock cycles for the algorithm. The third major column lists the number of multiplication and addition/subtraction operations. The fourth major column lists the number of multiplication and addition/subtraction functional units used for the algorithm. The fifth major column lists percentage of spare capacity for the multiplication and addition/subtraction functional units.

TABLE 1

| Algorithm | # CLK | # of operations | | # of Fus | | % Spare Capacity | |
| --- | --- | --- | --- | --- | --- | --- | --- |
|  |  | * | +/− | * | +/− | * | +/− |
| BPF | 13 | 12 | 17 | 1 | 2 | 24 | 35 |
| ARF | 10 | 16 | 12 | 2 | 2 | 20 | 40 |
| ARF | 18 | 16 | 12 | 1 | 1 | 11 | 33 |
| EWF | 19 | 8 | 26 | 1 | 2 | 58 | 32 |
| EWF | 16 | 8 | 26 | 2 | 2 | 75 | 19 |

The present invention is based, in part, on the realization that these spare computational cycles may be used to provide on-line testing. In particular, these spare computation cycles can be used for on-line BIST of functional units in the arithmetic data-path. Accordingly, the invention provides a versatile register transfer (RT) level BIST (dubbed "V-BIST") that uses the idle computation cycles in a design to generate pseudo-exhaustive test patterns, apply these test patterns, and compact the output test responses. The basic principles and implementation details of the invention may be better understood by reference to FIGS. 3A, 3B and 4 and TABLES 2A, 2B, 3, 4 and 5 which describe a sample design function, a sample test function and related performance characteristics.

Figures 3A, 3B:
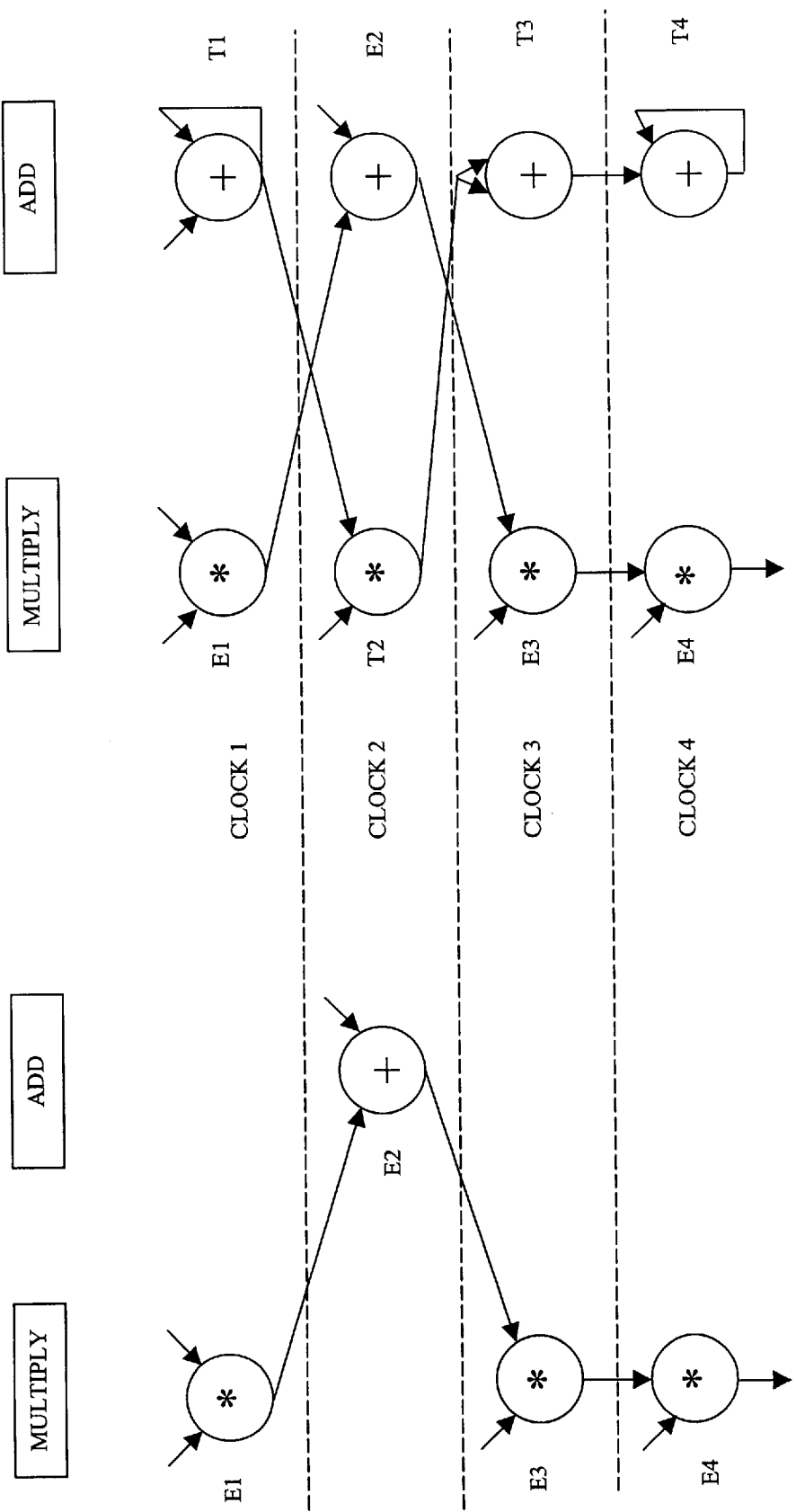
FIGS. 3A and 3B illustrate example behavioral compiler schedules for a basic design and a test design, respectively, in accordance with the invention.

TABLE 2A sets forth an example behavioral VHDL description of a relatively simple design function. The function (Out=(Inp×m1+m2)×m3×m4) has three multiplication operations $E_1$, $E_3$ and $E_4$ and one addition operation $E_2$. Assuming that each operation takes one clock cycle, this function requires four clock cycles. A Behavioral Compiler™ schedule for this function using one single-cycle multiplier and one single-cycle adder is shown in FIG. 3A. The multiplication operation has a spare capacity of 25% (this is because 1 out of the 4 multiplication cycles are idle) and the addition operation has a spare capacity of 75%. This basic design uses one register, one clock port, one reset port, one input port and one output port. See, for example, FIG. 4.

TABLE 2A

```
Library IEEE, SYNOPSIS;
use IEEE.std.logic.1164.all;
use IEEE.std.logic.arith.all;
entity example is
   port (CLK: IN std.logic;
      reset: IN std.logic;
      inp: IN unsigned (7 downto 0);
      S, Z: OUT unsigned (7 downto 0));
end example+test;
architecture example+test of example+test is
begin
   example+test: process
      constant m1: unsigned (7 downto 0) :=unsigned' ("00111000");
      constant m2: unsigned (7 downto 0) :=unsigned' ("00111001");
      constant m3: unsigned (7 downto 0):=unsigned' ("10111011");
      constant m4: unsigned (7 downto 0):=unsigned' ("10111010");
      variable R1, R2, R3, R4, R5, R6, SIGN, TPG: unsigned (7 downto 0);
      variable RT3, T1, T2, T3, T4: unsigned (15 downto 0);
         resetloop: loop
            mainloop: while (true) loop
               R1 := inp:
               T1 := R1 * m1; -- E₁
               R2 := T1 (15 downto 8);
               R3 := R2 + m2; -- E₂
               T2 := R3 * in3: -- E₃
               R4 := T2 (15 downto 8);
               T4 := R4 * m4; -- E₄
               R5:= T4 (15 downto 8);
               Z <= R5;
            end loop mainloop;
            wait until CLK'event and CLK = '1';
            exit resetloop when reset = '1';
         end loop reset loop:
   end process;
end example;
```

Spare capacity in functional modules in data-path applications as described above motivated the usage of a test function proposed in the Gizopoulos et al. paper referenced above. A behavioral VHDL description of this test function is shown in TABLE 2B. Referring to TABLE 2B, this test function consists of an addition operation for test pattern generation ($T_1$), an addition operation for test response compaction ($T_4$), a multiplication operation to exercise the multiplier ($T_2$) and an addition operation to add the two halves of the product to increase the randomness at its output ($T_3$). If the hardware executing the test function is completely testable, the functional units in the data-path can be completely tested by encapsulating every module of the design in some test function.

TABLE 2B

```
Library IEEE, SYNOPSIS;
use IEEE.std.logic.1164.all;
use IEEE.std.logic.arith.all;
entity test is
   port (ClK: IN std.logic;
      reset: IN std.logic;
      S: OUT unsigned (7 downto 0);
end test;
architecture test of test is
   begin
      test: process
         variable RT1, RT2, RT4, RT5, RT6, SIGN, TPG: unsigned
         (7 downto 0);
         variable RT3: unsigned (15 downto 8).
         begin
            reset loop: loop
               SIGN := (others => '0');
               TPG := (others => '0');
               mainloop: while (true) loop
                  RT1 (7 downto 4) := TPG (7 downto 4);
                  RT1 (3 downto 0) := TPG (7 downto 4);
```

TABLE 2B-continued

```
                  RT2 (7 downto 4) := TPG (3 downto 0);
                  RT2 (3 downto 0) := TPG (3 downto 0);
                  RT3 := RT1 * RT2; -- T₂
                  RT4 := RT3 (15 downto 8);
                  RT5 := RT3 (7 downto 0);
                  RT6: = RT4 + RT5; -- T₃
                  SIGN := RT6 + SIGN; -- T₄
                  if (TPG = unsigned' ("11111111")) then
                     TPC := "00000000";
                     S <= SIGN;
                  end if;
                  TPG := TPG + 1; --T₁
               end loop mainloop;
               wait until CLK'event and CLK = '1';
               exit resetloop when reset = '1';
            end loop resetloop;
         end process;
end test;
```

Initially, the testability of an array multiplier will be treated. It has been shown in Gizopoulos et al. that a set of 256 test patterns can provide nearly complete pseudo-exhaustive coverage of all internal adders of an array multiplier. This allows the detection of stuck-at faults along with any combinational faults confined within a cell of the multiplier. The test patterns may be generated using an adder with an increment "1" and an initial seed "0".

To verify the fault coverage of the above test function, stuck-at fault simulation of array multipliers of different sizes was conducted. TABLE 3 shows that a very high stuck-at fault coverage may be obtained for array multipliers. However, complete stuck-at fault coverage was not achieved using 256 test vectors because there may be some missing patterns at the inputs to certain cells of the multiplier, as reported in Gizopoulos et al.

TABLE 3

| Multiplier size | Total faults | Faults detected | Undetected faults | Fault coverage |
|---|---|---|---|---|
| 4 | 386 | 386 | 0 | 100.00% |
| 8 | 1787 | 1784 | 3 | 99.83% |
| 12 | 4203 | 4195 | 8 | 99.81% |
| 16 | 7571 | 7542 | 29 | 99.62% |
| 24 | 17117 | 17107 | 10 | 99.94% |
| 32 | 30579 | 30546 | 33 | 99.89% |

The testability of a ripple carry adder driven by the multiplier will now be treated. The testability of the ripple carry adder depends on the quality of patterns at the multiplier output. Randomness of these patterns may be increased by adding the two halves of the product. See Mukherjee et al., "Design of Testable Multipliers for Fixed-Width Data Paths," referenced above. This not only improves the testability of the adder, but also easily detects some of the difficult faults in the multiplier that would otherwise have required a very large number of test vectors. This same adder also is used for test response compaction, using the rotate carry addition scheme. A ripple-carry adder is a one-dimensional iterative structure of several full-adder cells. See, for example, adder 74 with adders cells 76 in FIG. 4. Complete state coverage of every alternate 4-bit subspace assures the eight possible patterns at the input of each full-adder cell constituting the ripple-carry adder. This guarantees a pseudo-exhaustive test coverage for all combinational faults within each cell.

TABLE 4 shows the latency required to achieve complete state coverage at the input of a ripple-carry adder, and the actual number of test vectors to cover all targeted subspaces. For example, for a 4-bit adder, only 73 test vectors (4.562× 16) are necessary to provide all the 16 patterns at every alternate 4-bit subspace. The stuck-at fault simulation showed that the vectors yield 100% coverage for all adder sizes.

TABLE 4

| Adder size | Latency | # of vectors |
|---|---|---|
| 4 | 4.5625 | 73 |
| 5 | 3.7500 | 60 |
| 8 | 6.8125 | 109 |
| 9 | 4.5625 | 73 |
| 10 | 5.6250 | 90 |
| 11 | 6.4375 | 106 |
| 12 | 9.8750 | 158 |
| 13 | 6.1875 | 99 |
| 14 | 3.9375 | 63 |
| 15 | 3.4375 | 55 |
| 16 | 4.5000 | 72 |

Referring now to TABLE 5, a behavioral VHDL description is shown that has both the original design function and the test function.

TABLE 5

```
entity example+test is
  port (CLK: IN std.logic;
    reset: IN std.logic;
    inp: IN unsigned (7 downto 0);
    Z: OUT unsigned (7 downto 0));
end example;
architecture example of example is
  begin
    example: process
      constant m1: unsigned (7 downto 0) :=unsigned' ("00111000");
      constant m2: unsigned (7 downto 0) :=unsigned' ("00111001");
      constant m3: unsigned (7 downto 0):=unsigned' ("10111011");
      constant m4: unsigned (7 downto 0):=unsigned' ("10111010");
      variable R1, R2, R3, R4, R5, R6: unsigned (7 downto 0);
      variable RT1, RT2, RT4, RT5, RT6, SIGN, TPG: unsigned
        (7 downto 0);
      variable T1, T2, T3, T4: unsigned (15 downto 0);
      begin
        resetloop: loop
          TPG := (others => '0');
          SIGN := (others => '0');
          mainloop: while (true) loop
            R1 := inp:
            T1 := R1 * m1; -- E₁
            R2 := T1 (15 downto 8);
            R3 := R2 + m2; -- E₂
            T2 := R3 * m3; -- E₃
            R4 := T2 (15 downto 8);
            T4 := R4 * m4; -- E₄
            R5:= T4 (15 downto 8);
            Z <= R5;
              --Begin Behavioral Code for Test
            RT1 (7 downto 4) := TPG (7 downto 4);
            RT1 (3 downto 0) := TPG (7 downto 4);
            RT2 (7 downto 4) := TPG (3 downto 0);
            RT2 (3 downto 0) := TPG (3 downto 0);
            RT3 := RT1 + RT2; -- T₂
            RT4 := RT3 (15 downto 8);
            RT5 := RT3 (7 downto 0);
            RT6 := RT4+RT5; -- T₃
            SIGN := RT6 + SIGN; -- T₄
            if(TPG = unsigned'("11111111")) then
              TPC := "00000000";
              S <= SIGN;
            end if;
            TPG := TPG + 1; --T₁
              --End Behavioral Code for Test
          end loop mainloop;
```

TABLE 5-continued

```
          wait until CLK'event and CLK = '1';
          exit resetloop when reset = '1';
        end loop reset loop:
      end process;
    end example+test;
```

Constraints are used to enforce the sharing of resources between the functional and test modes described above. First, the multiplication operation in the test function and the multiplication operation in the example function are bound to the same operator. Second, the addition operation in the test function and the addition operation in the example function are bound to the same operator. Third, the allocation should be performed in a way such that every functional unit in the original design is utilized for executing at least one operation in the test data-flow graph.

These constraints may be specified using Synopsys synthesis scripts. A Behavioral Compiler™ schedule for the testability enhanced VHDL description with test constraints is shown in FIG. 3B. As described in FIG. 4, the sample test design uses an extra input port 58, an extra output port 60 for the signature, and dedicated registers 62 and 64 for holding the generated test pattern and the corresponding signature, respectively. It also uses two registers 66 and 68 to store the left and right halves, respectively, of the output of the multiplier 70 for test purposes. It should be appreciated that the number, type and connectivity (e.g., to bus 86) of additional functional units (e.g., units 78 and 80) and other components depend on the characteristics of the design and test functions.

In accordance with the invention, a single controller (e.g., controller 81 in FIG. 4) may control the operations of the basic design and the test procedure. A designer can use the Behavioral Compiler™ to synthesize the logic and test functions together so that a single controller controls both the original and the BIST operations. Thus, in contrast with conventional test methods, a separate BIST controller is not required in a system implemented according to the invention.

The use of a high-level synthesis tool such as the behavioral-level compiler discussed herein provides a designer with the capability of automatically synthesizing the test function along with the controller function. Thus, the designer does not need to manually schedule every test at the RT-level which, given the scale of typical designs today, would be a monumental task.

Figure 4:
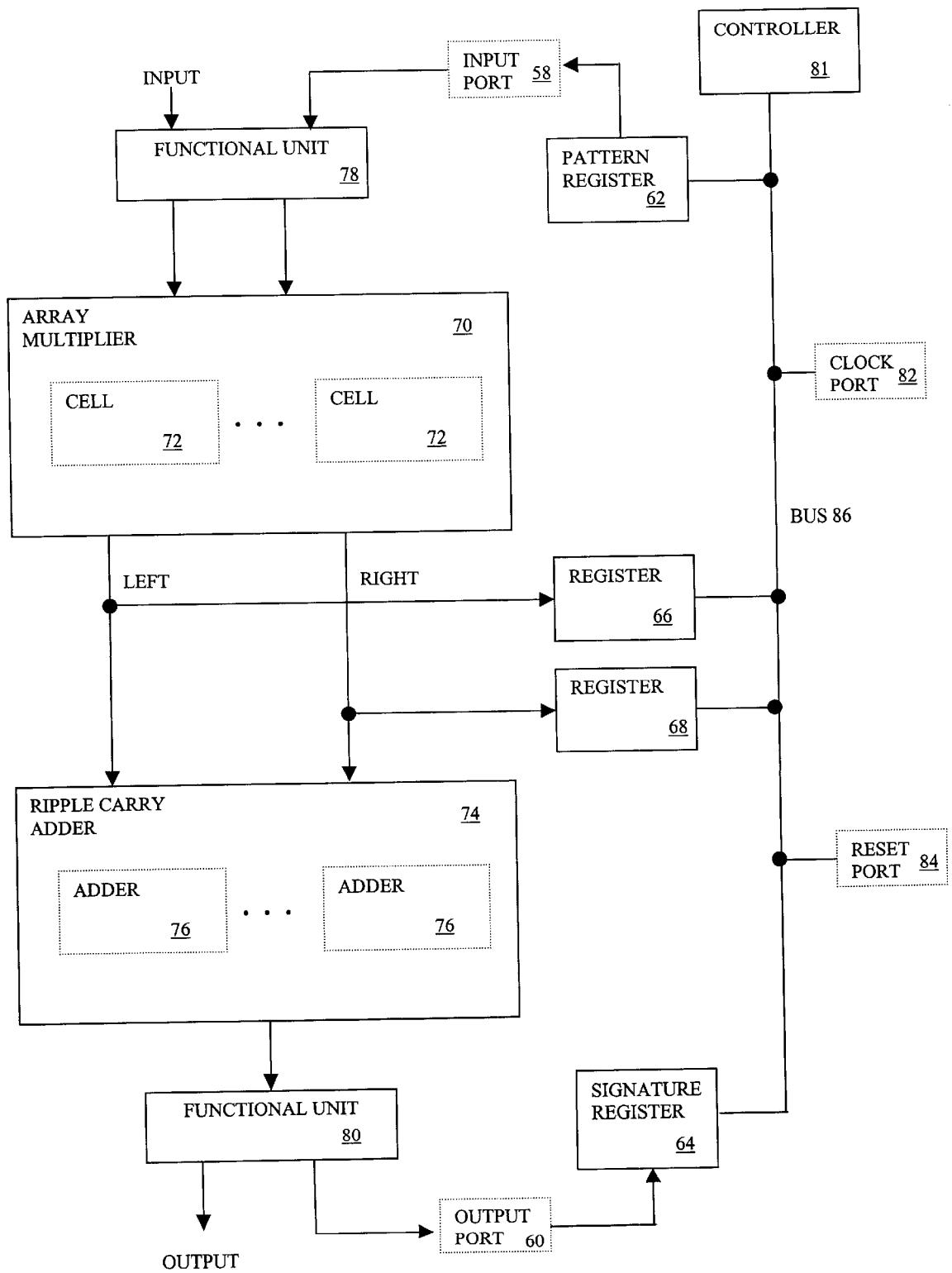
FIG. 4 is a block diagram illustrating one embodiment of functional components associated with a test procedure in accordance with the invention.

In summary, the controller 81 controls whether and when a given functional unit performs its normal operation or its test function. The controller 81 may control which data is sent to a given functional unit and may control where the functional unit sends its data. For example, the controller 81 may control whether a given functional unit (e.g., multiplier 70 or adder 74) receives test data rather than normal data. The controller 81 also may enable/disable operation of a functional unit. For example, the controller 81 may ensure that during a designated clock cycle a particular functional unit (e.g., unit 78) performs an arithmetic test generation function or a particular functional unit (e.g., unit 80) performs a test compaction function. Also, as discussed above, the controller 81 may coordinate the entire BIST operation, including handling faults. Finally, it should be appreciated that FIG. 4 depicts a typical circuit at a relatively high-level in order to reduce the complexity of the drawing. Thus, some of the circuitry and several of the connections in the circuit (e.g., between the functional units and the controller, clock and reset signals from bus 86 and between the registers and the functional units) are not illustrated.

The test latency for the example test can be obtained as follows. Since one pattern is applied per iteration and since an 8-bit additive pattern generator is used, it takes 256 iterations to apply all the generated patterns. Furthermore, since each iteration take four clock cycles, it takes 256×4= 1024 clock cycles for testing this design on-line. If the clock cycle duration is 25 nanoseconds, then the total time taken is 25.6 milliseconds.

Figure 5:
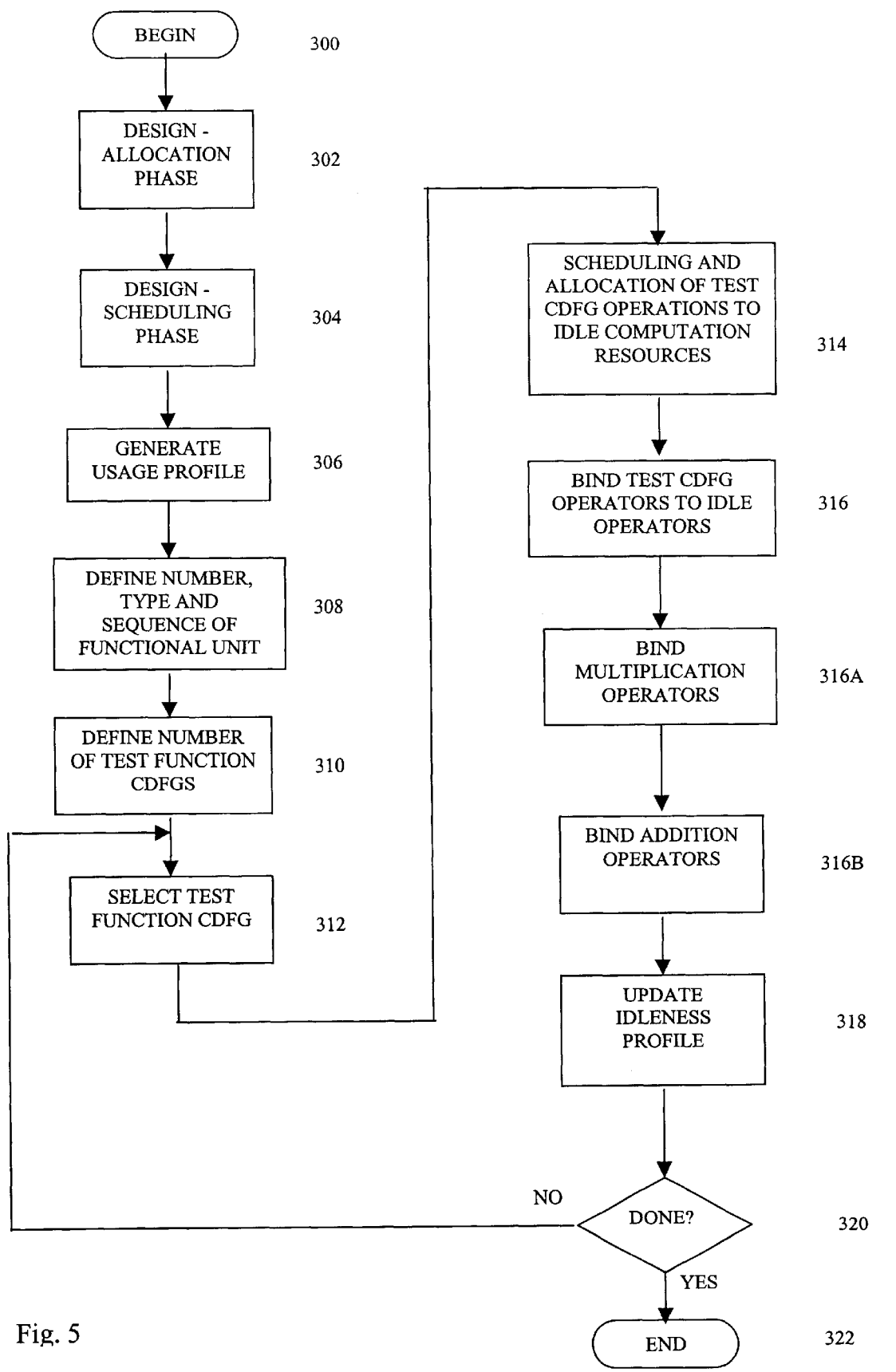
FIG. 5 is a flowchart illustrating one embodiment of integrated circuit design operations in accordance with the invention.

Referring to FIG. 5, an example V-BIST behavioral synthesis integrated circuit design process will now be treated in detail, beginning at block 300. Constraints are systematically incorporated into a design following the allocation and scheduling phases of behavioral synthesis at blocks 302 and 304. It is appropriate to incorporate the test constraints at the RT-level because there is a tight interdependence between the operation-to-operator binding of the scheduled control data-flow graph (CDFG) representation of a behavioral VHDL description, the spare computation capacity and on-line testability of the synthesized design. The design approach may be stated as follows:

Given a scheduled CDFG with an operator-to-functional unit binding,
  determine the number of test function CDFGs required to make the design testable;
  schedule the test function CDFG such that the operations in the test function CDFG only use the spare computation capacity in the design; and
  bind the operations in the test function CDFGs to the modules in the design such that all modules in the design are tested. As represented by blocks 306, 308 and 310, the circuit designer defines the test function to be incorporated into the design. Initially at block 306, idle computation cycles (operators and the clock cycles in which they are idle) in the basic design are identified. Consider a design that uses m multipliers and n adders and takes five clock cycles and that has an idleness profile shown in TABLE 6. In TABLE 6, an "x" in cell (i,j) indicates that operator j is used in clock cycle i. An empty cell denotes an idle computation cycle.

TABLE 6

| CLK Op. | x | | | + | | |
|---|---|---|---|---|---|---|
| # | 1 | ... | m | 1 | ... | n |
| 1 | | ... | | X | ... | |
| 2 | X | X | X | | | |
| 3 | X | ... | | | ... | |
| 4 | X | ... | X | | ... | X |
| 5 | X | ... | X | X | ... | |

The idleness profile of TABLE 6 guides an As Soon As Possible scheduling of the operations in the test CDFG as discussed below.

At block 308 (FIG. 5) the number, type and sequence of test operations for a given test are chosen. Note that, in practice, the test may be pre-defined. Thus, the order of operations depicted in FIG. 5 merely illustrates one possible implementation of the test design procedure.

At block 310, the designer determines the number of test function CDFGs required to make the design testable.

Once the test function is defined, the test function is scheduled and bound to idle operators (blocks 312 through 320) in a manner that attempts to ensure that all modules in the design will be tested. This procedure may be summarized as follows:

while all modules are not testable {
  Choose a test CDFG instance;
  Schedule test CDFG using the idleness profile;
  Bind the test CDFG operations to maximize testable modules;
  Update the idleness profile; }

At block 312, the designer selects a particular instance of a test CDFG to schedule and bind.

At block 314 the designer schedules the operations in the test CDFG. This includes identifying idle computation cycles and assigning the test CDFG to them. For example, the CDFG for the test function discussed previously is $T_1^+->T_2^+->T_3^+->T_4^+->T_1^+$. The schedule of the test CDFG that matches the idleness profile of TABLE 6 is shown in TABLE 7. Note that since there is no idle multiplier in clock cycle two, $T_2$ is scheduled in clock cycle three. A key objective of this scheduling step is to assign the test CDFG operations to idle computational resources.

TABLE 7

| CLK | Test | x | | | + | | |
|---|---|---|---|---|---|---|---|
| # | Op. | 1 | ... | m | 1 | ... | n |
| 1 | $T_1^+$ | | ... | | x | ... | t |
| 2 | | x | x | x | | | |
| 3 | $T_2^x$ | x | ... | | | ... | |
| 4 | $T_3^+$ | x | ... | x | | ... | x |
| 5 | $T_4^+$ | x | ... | x | x | ... | |

At blocks 316, 316A and 316B the designer binds the operations in the test CDFG to the idle operators. As discussed above, this includes binding the multiplication operation in the test function and the multiplication operation in the example function to the same operator (block 316A) and binding the addition operation in the test function and the addition operation in the example function to the same operator (block 316B). The key objective of this step is to maximize the number of modules that participate in the test function. To differentiate the binding of the operations from the basic function, a "t" is placed in the cell (i,j) if the test operation scheduled in clock cycle i is bound to operators j. The problem then is equivalent to binding the test CDFG such that there is at least one "t" per column.

TABLE 8 shows the updated idleness profile after one instance of the test CDFG is scheduled and bound (block 318). As represented by block 320, the above steps are repeated until all modules in the design become testable.

TABLE 8

| CLK | Test | x | | | + | | |
|---|---|---|---|---|---|---|---|
| # | Op. | 1 | ... | m | 1 | ... | n |
| 1 | $T_1^+$ | | ... | | x | ... | t |
| 2 | | x | x | x | | | |
| 3 | $T_2^x$ | x | ... | t | | ... | |
| 4 | $T_3^+$ | x | ... | x | t | ... | x |
| 5 | $T_4^+$ | x | ... | x | x | ... | t |

The process described above incorporates the test constraint into the design using a post processing step that follows the primary scheduling and binding. This two step approach of design and test function insertion closely mimics the two phase design methodology used in the integrated circuit design industry. Specifically, designers first provide the test engineer with a behavioral description and the synthesis scripts. Then, the test engineer adds the test functionality and imposes additional constraints without modifying the design constraints.

It should be appreciated that the scheduling process according to the invention as described above entails imposing non-uniform resource constraints. This is in contrast to traditional scheduling where only overall resources are specified (i.e., used in the first phase by the designer). In the process described above, the imposition of non-uniform resource constraints may be necessary to preserve the existing resource usages in each clock cycle.

In view of the teachings herein, it should be apparent to one skilled in the art that the process of incorporating the test constraints into the design may be integrated into the design phase itself. That is, the designer would schedule and bind the test constraints during the design phase.

Also, it should be appreciated that the testing method described herein is a general technique and is independent of the test function. In practice, a library of test functions (such as the test function of TABLE 2B) may be defined. Thus, for a given application, the most appropriate test candidate would be selected from the library.

As described, the above embodiments target faults in arithmetic modules such as adders and multipliers in the data-path during on-line testing. In applications such as digital signal processors, a designer may choose to only use the method of the invention in the data-path. Such a design choice can be justified because arithmetic modules make up a significant portion of such integrated circuits. In this case, the techniques of the invention may be used in conjunction with other testing techniques. For example, faults in other modules such as multiplexers and control logic that are not targeted by the testing methods of the invention may be tested using off-line using schemes such as scan and random logic BIST. The invention provides an improved testing method that requires less area overhead and faster test time than many conventional techniques. TABLES 9, 10 and 11 illustrate example overhead and test latency for several digital signal processor applications. Here, test constraints have been incorporated in Behavioral Compiler™ generated arithmetic data-paths using Synopsys synthesis scripts. The digital signal processor applications span a range of computational structures and characteristics and include the bandpass filter (BPF), AR-filter (ARF) and the fifth order elliptic filter (EWF).

In TABLE 9, the second major column lists the number of clock cycles in the design. The third and fourth major columns list the spare capacities in the basic design and the test design, respectively. In the basic design, the multiplier spare capacity ranged from 7.6%–75% while the adder spare capacity ranged from 19%–40%. The spare capacity in these designs is used for the test function. As a consequence, the spare multiplication capacity decreased to 0%–69% while the adder spare capacity decreased to 10%–23%.

TABLE 9

| Algo-rithm | # CLK | Basic Design * | Basic Design +/- | With Test * | With Test +/- |
|---|---|---|---|---|---|
| BPF | 13 | 7.6 (12/13) | 34.6 (9/26) | 0 (0/26) | 23.1 (6/26) |
| ARF | 10 | 20 (4/20) | 40 (8/20) | 10 (2/20) | 10 (2/20) |
| ARF | 18 | 11.1 (2/18) | 33.3 (6/18) | 5.5 (1/18) | 16.6 (3/18) |
| EWF | 19 | 55.5 (10/18) | 31.6 (12/38) | 50.0 (9/18) | 15.7 (6/38) |
| EWF | 16 | 75.0 (24/32) | 19.0 (6/32) | 69.0 (22/32) | 13.0 (4/32) |

In TABLE 10, the first major column lists the application type, the resources used and the clock cycle duration for each of the designs. For example, the ARF algorithm in the first row uses one multiplier functional unit (designated "1*") and one adder functional unit (designated "1+"). The clock cycle duration is 25 nanoseconds. An instance of the algorithm executes in eighteen clock cycles. The minor columns in the second major column list the area of the basic design (in grid units), the area of the design (in grid units) after it has been modified to include BIST, and the percentage of area overhead. The minor columns in the third major column list the number of registers in the basic design, the number of registers in the test design and the percentage of register overhead.

TABLE 10

| Algorithm | Area ($X^2$, grid units) Basic | V-BIST | % Ovhd | # of Reg. Basic | V-BIST | % Ovhd |
|---|---|---|---|---|---|---|
| ARF (1*,1+,25ns, 18 clk) | 5574 | 6910 | 23 | 8 | 11 | 37 |
| ARF (2*,2+,25ns, 10 clk) | 7606 | 10253 | 34 | 7 | 12 | 71 |
| BPF (1*,2+/-,25ns, 13 clk) | 6159 | 7966 | 22 | 10 | 15 | 50 |
| EWF (1*,2+, 12.5ns, 19 clk) | 8690 | 11008 | 26 | 13 | 19 | 46 |
| EWF (2*,2+,25ns, 16 clk) | 8234 | 10252 | 25 | 10 | 15 | 50 |

A few comments regarding the area overhead are in order. The 18 clock cycle AR filter design uses a single-cycle adder and a single-cycle multiplier. Hence, this design uses a single instance of the test function. The 10 clock cycle AR filter design on the other hand uses two single-cycle adders and two single-cycle multipliers. Consequently, the test-enabled version uses two instances of the test function. This is one of the main sources of the area overhead. This overhead can be reduced by using a test function that uses at least two multiplication operations and at least two addition operations. The 13 clock cycle bandpass filter design uses a single-cycle multiplier and two single-cycle adders. However, only one instance of the test function is used in this design. One of the adders is used as the additive pattern generator while the other adder is used to increase the randomness of the multiplier output and as an additive test output compactor. This still ensures that both the adders are fully tested as they require a small number of patterns. The 19 clock cycle elliptic wave filter design uses a two-cycle multiplier and two single-cycle adders. On the other hand, the 16 cycle elliptic wave filter design uses two single-cycle multipliers and two single-cycle adders. Consequently, two instances of the test CDFG are implemented to test the two adder multiplier pairs in parallel.

The register overhead of the test-enabled design is summarized in minor columns 5, 6 and 7 of TABLE 10. As discussed above, the registers used in the test function include a test pattern register, a signature register and two registers that store the left and right halves of the multiplier output. Since the test pattern generator and the signature registers store the essential state of the test function, they cannot be shared with the normal function. Furthermore, the test function and the normal function are simultaneously active. These two constraints on the lifetimes of the variables account for the register overhead. From TABLE 10 it may be observed that although the overhead is 50% on an average when only the registers are considered, the overall area overhead is much less. Consequently, it should be appreciated that a register count alone is not necessarily a good measure of the overall area overhead.

For a BIST scheme to be applicable in field operation, it should have a very short test time (for example, a few milliseconds). The invention accomplishes this, in part, by using a relatively small test set. Consider a data-path design that takes 20 clock cycles for processing one set of data inputs with each clock cycle having a duration of 20 nanoseconds. Assume that application of a test pattern and compacting the data-path's response to it also takes 20 clock cycles. This yields a latency of 400 nanoseconds (20×20) for one test pattern. Applying a fixed size test set with 250 patterns entails an overall test latency of only 100 milliseconds (400 ns×250).

TABLE 11 summarizes the test latency for each of the digital signal processor designs discussed above. Test latency is computed as: (the number of cycles for one pattern)×(the number of patterns)×(the clock duration). TABLE 11 illustrates that the test latency for these designs is in the order of milliseconds. This is very small when compared to the thousands of clock cycles required for concurrent testing such as described in the Saluja et al. article referenced above. Consequently, an integrated circuit constructed according to the invention detects faults in a very short period of time, thereby supporting timely on-line diagnosis.

TABLE 11

| Algorithm | # of cycles | Clock duration | test latency |
| --- | --- | --- | --- |
| ARF | 18 | 25 ns | 115.2 ms |
| ARF | 10 | 25 ns | 64 ms |
| BPF | 13 | 25 ns | 83.2 ms |
| EWF | 19 | 12.5 ns | 60.8 ms |
| EWF | 16 | 25 ns | 102 ms |

From the above, it may be seen that the invention provided an improved technique for testing integrated circuits and other electronic devices. First, it enables a BIST to be run in parallel with functional chip and system test during production testing. This yields reduced test time. Second, faults may be detected during field operation without taking the system off-line. Furthermore, diagnostic information may be provided on a continuous basis. Finally, the area overhead required is significantly less than the area overhead required for conventional on-line testing schemes and separate on-line/off-line BIST.

In particular, the invention provides several advantages over concurrent testing. The method of the invention does not need to use normal inputs for testing. Rather, it can generate test patterns on-line and uses these test patterns. The method of the invention may be used to target arithmetic data-paths and exploit small test sets to yield short test latencies. Concurrent testing, by comparison, does not yield such short test latencies. This is because all inputs to the normal circuit are not equally probable. To overcome this shortcoming, concurrent testing may have to be supplemented with techniques such as the use of time-out indicators.

In summary, the invention provides a very effective off-line and on-line self test. The inherent functionality of a circuit is exploited to obtain a complete off-line manufacturing test function execution. This results in a substantial reduction in the hardware overhead (often around 150%) normally associated with conventional on-line schemes. In some applications, only a 30% average area overhead is required for the test function. The overhead may be even less in large designs with numerous built-in registers. The invention identifies a wide spectrum of faults as compared to single stuck-at faults, thereby increasing the possibility of detecting many more permanent defects. Moreover, due to the use of regular iterative structures for most functional blocks in data-path architectures, the proposed method yields very short test latencies. This enables relatively fast on-line detection of system malfunctions. The invention also proves very useful for in-field system level diagnosis and repair, such that a faulty chip and/or board can be quickly identified and replaced immediately with a good part.

While certain specific embodiments of the invention are disclosed as typical, the invention is not limited to these particular forms, but rather is applicable broadly to all such variations as fall within the scope of the appended claims. To those skilled in the art to which the invention pertains many modifications and adaptations will occur. For example, various test procedures may be used in practicing the invention. A variety of methods may be used for coordinating the use of common resources by the test functions and the design functions. For example, high-level synthesis tools other than those described herein may be used. The teachings of the invention are applicable to many applications including, but not limited to, the data-path applications described herein. Thus, the specific structures and methods discussed in detail above are merely illustrative of a few specific embodiments of the invention.

What is claimed is:

1. A method of on-line testing of an integrated circuit, the integrated circuit defining a plurality of functional units, said functional units having idle processing periods during operation of the integrated circuit, the method comprising the steps of:
generating a pseudo-exhaustive test pattern;
generating a usage profile to identify at least one idle functional unit;
applying the test pattern to at least one functional unit during at least one idle period of the at least one functional unit; and
compacting data resulting from the application of the test pattern to the at least one functional unit.

2. The method of claim 1 wherein the test pattern is generated during at least one idle period of the at least one functional unit.

3. The method of claim 2 wherein the data is compacted during at least one idle period of the at least one functional unit.

4. A method of designing an integrated circuit to provide on-line testing of the integrated circuit, the method comprising the steps of:
generating a design by defining operations to be performed by a plurality of functional units;
generating a usage profile to identify at least one idle functional unit in the design; and
assigning an operator for a test function to an idle functional unit.

5. The method of claim 4 wherein the step of generating a usage profile includes identifying at least one idle computation cycle in the design.

6. The method of claim 4 wherein the assigning step includes assigning a test control data-flow graph operation to at least one idle functional unit.

7. The method of claim 4 wherein the step of generating a usage profile includes identifying an idle arithmetic operator in the design.

8. The method of claim 7 wherein the assigning step includes binding an operation in a test control data-flow graph to an idle arithmetic operator.

9. The method of claim 4 wherein the assigning step includes binding a multiplication operation in a test function and a multiplication operation in a design function to a specific functional unit.

10. The method of claim 4 wherein the assigning step includes binding an addition operation in a test function and an addition operation in a design function to a specific functional unit.

11. The method of claim 4 wherein the step of generating a design defines a number of multiplication operators and addition operators for the design, wherein the method comprises modifying the design to include on-line testing, the method further including the step of setting a number of multiplication operators and addition operators for the design as modified to include on-line testing to be equal to the number of multiplication operators and addition operators for the design.

12. The method of claim 4 further including the step of determining a number of test function control data-flow graph operations required to provide a testable design.

13. The method of claim 4 wherein the assigning step includes scheduling a test function control data-flow graph operation, whereby the operation only uses spare computation capacity in the design.

14. The method of claim 4 wherein the assigning step includes binding at least one test function control data-flow graph operation to each functional unit in the design, whereby all functional units in the design are tested during on-line testing.

15. The method of claim 4 wherein the functional units comprise at least one of the group consisting of adders and multipliers.

16. The method of claim 4 wherein the step of generating a design includes allocation and scheduling phases of behavioral synthesis.

17. The method of claim 4 wherein the step of generating a design includes generating a scheduled control data-flow graph representation of a behavioral VHDL description.

18. The method of claim 4 wherein the step of generating a design comprises using a Synopsys behavioral compiler.

19. An integrated circuit design tool comprising:
    a data interface for receiving a behavioral synthesis program for generating an integrated circuit design;
    a data memory for storing the behavioral synthesis program, the behavioral synthesis program including program code for performing the steps of:
        generating a design by defining operations to be performed by a plurality of functional units;
        generating a usage profile to identify at least one idle functional unit; and
        assigning an operator for a test function to an idle functional unit; and
    a processor for executing the behavioral synthesis program.

20. An integrated circuit comprising:
    a plurality of arithmetic functional units;
    a pattern generator for producing a pseudo-exhaustive test pattern;
    a data memory, comprising: computer code for generating a usage profile to identify at least one idle functional unit;
    a controller for controlling application of the test pattern to at least one of the arithmetic functional units during on-line operation of the integrated circuit; and
    a compactor for compacting data resulting from the application of the test pattern to the at least one arithmetic functional unit.

21. The integrated circuit of claim 20 further comprising a data signature analyzer for analyzing the compacted data to determine whether an error occurred.

22. A method of on-line testing of an integrated circuit, the integrated circuit defining a plurality of functional units, the method comprising the steps of:
    initiating on-line operation of the integrated circuit;
    generating a usage profile to identify at least one idle functional unit;
    generating a pseudo-exhaustive test pattern during the on-line operation of the integrated circuit;
    applying the test pattern to at least one functional unit; and
    compacting data resulting from the application of the test pattern to the at least one functional unit.

23. The method of claim 22 further including the step of analyzing the compacted data to determine whether an error occurred.

24. The method of claim 22 further including the step of reporting the error.

25. A method of on-line testing of an integrated circuit, the integrated circuit defining a plurality of functional units for implementing design operations, said functional units having idle processing periods during operation of the integrated circuit, the method comprising the steps of:
    generating a usage profile to identify at least one idle functional unit;
    generating, by at least one functional unit, a test pattern;
    applying the test pattern to at least one functional unit during at least one idle period of at least one functional unit; and
    compacting data resulting from the application of the test pattern to at least one functional unit.

26. The method of claim 25 wherein the compacting step is performed by at least one functional unit.

* * * * *